United States Patent [19]
Malhi et al.

[11] Patent Number: 5,293,053
[45] Date of Patent: * Mar. 8, 1994

[54] ELEVATED CMOS

[75] Inventors: Satwinder S. Malhi; Ravishankar Sundaresan, both of Garland; Shivaling S. Mahant-Shetti, Richardson, all of Tex.

[73] Assignee: Texas Instruments Incorporated, Dallas, Tex.

[*] Notice: The portion of the term of this patent subsequent to Dec. 1, 2008 has been disclaimed.

[21] Appl. No.: 655,500

[22] Filed: May 1, 1991

Related U.S. Application Data

[63] Continuation of Ser. No. 916,664, Oct. 8, 1986, abandoned.

[51] Int. Cl.⁵ ............ H01L 27/02; H01L 29/78; H01L 27/01; H01L 29/06
[52] U.S. Cl. .................... 257/330; 257/334; 257/369; 257/372; 257/377
[58] Field of Search .............. 357/42, 23.4, 23.7, 357/55, 59, 4, 330, 334, 369, 372, 377, 412

[56] References Cited

U.S. PATENT DOCUMENTS

| | | | |
|---|---|---|---|
| 4,554,572 | 11/1985 | Chatterjee | 357/42 |
| 4,566,025 | 1/1986 | Jastrzebski et al. | 357/42 |
| 4,566,914 | 1/1986 | Hall | 357/42 |
| 4,660,062 | 4/1987 | Nishizawa et al. | 357/42 |
| 4,670,768 | 6/1987 | Sunami et al. | 357/42 |
| 4,713,678 | 12/1987 | Womack et al. | 357/55 |
| 4,740,826 | 4/1988 | Chatterjee | 357/42 |
| 4,984,030 | 1/1991 | Sunami et al. | 257/334 |
| 5,072,276 | 12/1991 | Malhi et al. | 357/42 |

*Primary Examiner*—Mark V. Prenty
*Attorney, Agent, or Firm*—John D. Crane; Richard L. Donaldson; William E. Hiller

[57] ABSTRACT

A new class of CMOS integrated circuits, wherein the PMOS and NMOS devices are both configured as vertical transistors. One trench can contain a PMOS device, an NMOS device, and a gate which is coupled to control both the PMOS device and the NMOS device. Latchup problems do not arise, and n+ to p+ spacing rules are not required.

16 Claims, 10 Drawing Sheets

ELEVATED CMOS

This is a continuation of application Ser. No. 06/916,664, filed Oct. 8, 1986 and now abandoned.

BACKGROUND AND SUMMARY OF THE INVENTION

The present invention relates to integrated circuits and to methods for manufacturing them.

Conventional bulk CMOS (where the NMOS devices are formed in p-type areas of the substrate, and the PMOS devices are formed in n-type areas) does not scale very well. The circuit condition known as latchup (i.e. the firing of a parasitic thyristor between power and ground) must be avoided, and this means that a large minimum spacing from n+ to p+ source/drains—typically five times the minimum geometry or more—must be maintained by the circuit designer. This spacing rule means that a significant fraction of the total circuit area is consumed as mere empty space between NMOS and PMOS areas. As circuits are scaled to smaller dimensions, the p+ to n+ minimum spacing normally cannot be scaled as rapidly as the minimum geometry, and therefore an even larger fraction of total area is wasted on the n+ to p+ spacing.

To avoid this constraint and also provide increased immunity to single event upset, various SOI (silicon-on-insulator) devices have been proposed. If the NMOS and PMOS devices are not part of the same semiconductor body, then latchup cannot happen, and n+ to p+ spacing ceases to be a relevant constraint.

However, many such proposed structures have turned out to have substantially lower performance than bulk CMOS, and have also turned out to be very difficult to fabricate. The lower performance commonly results from the use of polysilicon or annealed polysilicon for one of the device types, usually the PMOS device. The difficulties in fabrication are exacerbated by attempts to make a stacked CMOS structure—i.e. one in which the PMOS device lies over the gate to the NMOS device, so that the same line which is the front side gate for the NMOS device is the backside gate for the PMOS device—although it has been widely recognized that such structures would be highly advantageous for their compactness. One example of such a proposed structure is shown in U.S. Pat. No. 4,502,202 to Malhi.

The present invention provides a different way to build CMOS structures which are extremely compact, free of latchup and associated design constraints, relatively immune to single event upset, provide high channel mobility, and are not excessively difficult to fabricate.

In the present invention, CMOS logic is configured by placing the NMOS and PMOS devices on facing walls of a trench, with an insulated gate in between them to control both.

Another advantage of the present invention is that logic built according to the present invention is extremely easy to design, since the necessity for an n+ to p+ design rule is totally removed. Since design time is a major factor in modern integrated circuit costs, this is an important advantage.

Published work has described a vertical IGFET on the sidewall of a trench. See Richardson et al., A Trench Transistor DRAM Cell (paper 29.6 at the 1985 IEDM), which is hereby incorporated by reference. However, such vertical devices are not well suited for random logic, because the bottom node is not easily accessible. Thus such a transistor would be well suited for the pass transistor of a one transistor DRAM cell, but would be less easily adaptable to provide a pass gate in an SRAM cell.

Thus, it is an advantage of the present invention that a highly compact transistor-in-trench structure is provided, wherein the bottom node is readily accessible.

Moreover, the best prior transistor-in-trench structures have normally had the channels of the transistors in bulk material, so that p+ to n+ spacings would still be a potential problem if such structures were sought to be adapted to CMOS.

Thus, it is a further advantage of the present invention that a highly compact transistor-in-trench structure is provided, wherein full CMOS circuits can be implemented without n+ to p+ spacing problems.

In some embodiments of the invention, some recesses can be configured to contain only NMOS devices while other nearby trenches are configured to contain only PMOS devices. This loosens the alignment constraints of fabricating both NMOS and PMOS devices in a common trench, and still retains some of the advantages of the invention for close-packing of CMOS circuits.

In some embodiments of the invention, a self-aligned etch is used to bring a metal pillar contact to the output node of a CMOS inverter up through the middle of a trench, so that contact from metallization to the active device is simplified. Such embodiments have the further advantage, in addition to others mentioned, that extremely compact layout is permitted.

In some embodiments of the invention, the inverter is fully oxide isolated, with no contacts to substrate whatsoever. Such embodiments have the further advantage, in addition to others mentioned, that single-event upset is very much reduced.

In some embodiments of the invention, the power and ground lines are routed through buried diffusions, but all nodes to which discretionary wiring is necessary are brought out to surface areas. Such embodiments have the further advantage, in addition to others mentioned, that contact etching and constraints are simplified, and the design rules relating to placement of contacts can in general be simplified.

In some embodiments of the invention, the etch which forms the input gate is prolonged to etch into the substrate, and oxide refill of this etch then provides improved isolation between power and ground diffusions in the substrate.

In some embodiments of the present invention, the n+ and p+ polysilicon layers which provide the top source/drain contacts for the NMOS and PMOS devices are elongated past the active area of the devices, so that a surface contact can be made to these polysilicon lines to provide the output.

In the presently preferred process embodiment of the invention, after patterned implantations have formed the bottom n+ and p+ regions, a selective epitaxy step is used to grow upward (into an opening in field oxide) the nearly intrinsic silicon which will provide the channel regions for the active devices. A patterned implant is then used to dope the channel regions appropriately. (Optionally, if this epitaxial material is deposited using appropriate in-situ doping, only one side may need a patterned implant to set its conductivity type.)

After this has been done, a top polysilicon layer is deposited and heavily doped using a patterned implantation (either with one or with two masking steps), to form n+ and p+ polysilicon regions which will provide the top source/drain contact areas for the NMOS and PMOS devices. (Outdiffusion from this heavily doped polysilicon film will actually form shallow junctions within the crystalline regrown semiconductor, which will function as the actual source/drain regions.)

Another patterned etch is then used to cut a slot across the epitaxial material within at least some of the openings, so that an insulating dielectric can be formed on the sidewalls of this slot and the gate electrode placed therein.

In some embodiments, a self-aligned sequence is then used to define a smaller hole within this slot, so that an insulated metal post can reach down and make contact with the bottom n+ and p+ diffusions. However, this class of embodiments has the disadvantage that the parasitic capacitance of the input to the output nodes may be rather large.

In embodiments where the bottom n+ and p+ regions are not oxide isolated, one of them is preferably junction isolated. For example, where the substrate is p-type, the p+ bottom region is preferably shallower than the n+ bottom regions, so that the p+ bottom region is junction isolated from the substrate.

In another class of embodiments, solid phase epitaxy is used to define crystalline semiconductor on oxide regions for the bottom n+ and p+ regions.

Since the input gate is itself preferably conformally deposited polysilicon, this input gate may be routed across the chip to perform other circuit functions as well.

Since the conductivity types of the polysilicon channels are determined by implantation, it is not strictly necessary for every trench to have a PMOS device on one side and an NMOS device on the other. (This configuration provides a single inverter gate, but of course many other logic gate configurations are desirable.) Some trenches may include two PMOS devices, some trenches may include two NMOS devices, some trenches may include only one active device, or (with the addition of some additional steps (e.g. a second slot etch) to provide isolation along the trench walls) more than two active devices may be included in a single trench.

In some embodiments of the present invention, the bottom n+ and the bottom p+ nodes do not have to be connected together. This provides substantial additional flexibility in configuring random logic.

According to the present invention there is provided: A method for fabricating integrated circuits, comprising the steps of: providing a substrate including at least one monocrystalline semiconducting portion near a surface thereof; introducing dopants at high concentration into predetermined surface areas of said semiconducting portion of said substrate; providing a growth-blocking material over said semiconducting portion of said substrate, said growth-blocking material including openings to expose said semiconducting portion of said substrate at predetermined locations; selectively epitaxially growing additional semiconductor material on said substrate, under conditions such that said additional semiconductor material grows epitaxially on exposed areas of said monocrystalline semiconducting portion of said substrate and does not grow at all on said growth-blocking material; introducing dopants into said selectively epitaxially grown material in areas such that in at least some of said openings in said growth-blocking material said selectively epitaxially grown material includes both n-type portions and p-type portions; etching away portions of said selectively epitaxially grown material in at least some of said openings to separate n-type portions thereof from p-type portions thereof; forming a thin film insulated control gate layer having portions extending into at least one said recess and capacitively coupled to both said n-type portion and p-type portion of said selectively epitaxially grown material.

According to the present invention there is also provided: An integrated circuit device comprising: a thick dielectric having at least one recess therein; an n-type insulated gate vertical field effect transistor on one side of said recess; a p-type insulated gate vertical field effect transistor on another side of said recess separate from said n-type vertical field effect transistor; and a control gate in said recess connected to control current flow both in said n-type and in said p-type field effect transistors.

According to the present invention there is also provided: An integrated circuit device comprising: a thick dielectric having at least one recess therein; a trench running across said recess from one side to an opposite side; a body of n-type semiconducting material on a third side of said recess, and a body of p-type semiconducting material on a fourth side of said recess, said n-type body being laterally separated from said p-type body within said recess by said trench; a control gate located in said recess and insulated from and capacitively coupled to a surface of said n-type body and also a surface of said p-type body, whereby voltages applied to said control gate control surface carrier densities at respective surfaces of said respective bodies.

BRIEF DESCRIPTION OF THE DRAWINGS

The present invention will be described with reference to the accompanying drawings, wherein:

FIGS. 3 and 4 show two examples of other active device configurations which might optionally be included within the same integrated circuit as the structure of FIG. 1; in FIG. 3 a gate 28 addresses only a single PMOS device (with a channel in n-type epitaxial material 22), and in FIG. 4 a gate 28 addresses two PMOS devices (which have their bottom source/drain terminals connected), one on each side of the trench.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

Figure 1:
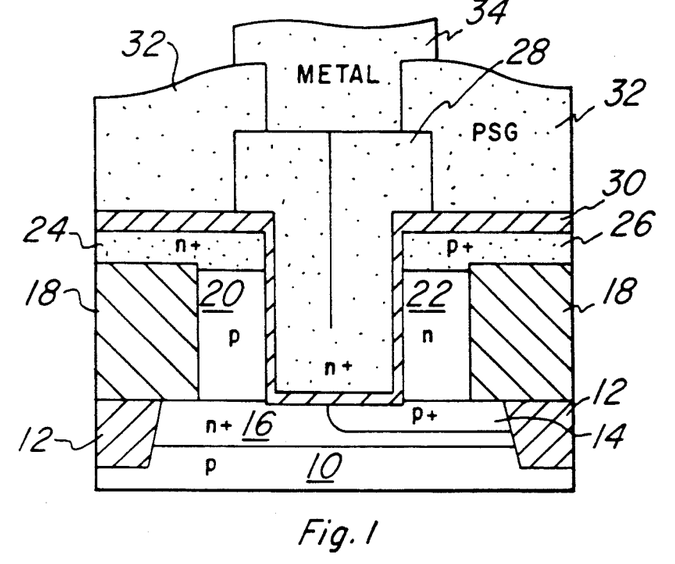
FIG. 1 shows a sample embodiment of the present invention.

FIG. 1 shows a sample embodiment of the present invention. A substrate 10, which is, for example, single crystal p-type silicon, is covered by field oxide 12 everywhere except in moat regions. The moat region in this figure includes a p+ diffusion 14 and an n+ diffusion 16, which is deeper than the p+ diffusion 14 so as to isolate it from the p-type substrate 10. A second thick oxide 18 overlies portions of the field oxide 12 and of the moat regions, and recesses are cut in this second thick oxide 18 in desired active device locations. Epitaxial (i.e. single crystalline) material is formed inside this recess, to provide p-type channel regions 20 and n-type channel regions 22. An overlaid polysilicon layer provides n+ top source/drain-contact regions 24 and p+ top source/drain-contact regions 26. An insulated polysilicon plug 28 (insulated from regions 14, 16, 20, 22, 24, and 26 by a thin oxide 30) extends down into the recess in the thick oxide 18, and this poly plug 28 is capacitively coupled through oxide 30 to control the vertical NMOS device defined by regions 16, 20 and 24, and also the vertical PMOS device defined by regions 14, 22, and 26. A patterned metal layer 34, insulated by an interlevel dielectric 32, makes contact to selected locations of polysilicon gate layer 28 and elsewhere. FIGS. 2A through 2G show a sample process sequence for fabricating this structure.

Figure 2A:
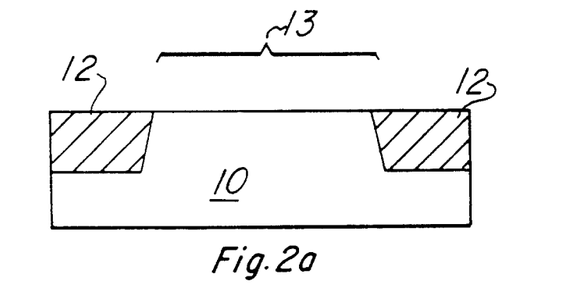
FIGS. 2A through 2G show a sample process sequence for fabricating this structure.

FIG. 2A shows the substrate 10 and field oxide regions 12. The field oxide regions 12 (formed by LOCOS, MF$^3$R (SWAMI), or by other conventional means), define moat regions 13 as shown. Implants now form the p+ regions 14 and n+ regions 16 in the moat regions 13 of the substrate 10. A thick oxide 18 is now deposited and patterned, to expose some portions of the moat regions. Note that, in the example shown in FIG. 2C, the thick oxide 18 is shown as having coincident edges with the field oxide 12 which defines the moat region, but this is not necessarily the case, and in fact will not everywhere be the case.

A selective epitaxial growth step is now used to grow single crystal silicon over areas where silicon is exposed, without growing silicon over oxide regions. The conditions for such growth can be, for example, SiH$_2$Cl$_2$ plus HCl plus H$_2$ at 50 Torr at 950° C. Selective epitaxial growth conditions are also described in the following paper, which is hereby incorporated by reference: "One-quarter micron CMOS Isolation Technique with Sidewall Insulator and Selective Epitaxy," 1986 IEDM, pages 419–422.

Figure 2B:
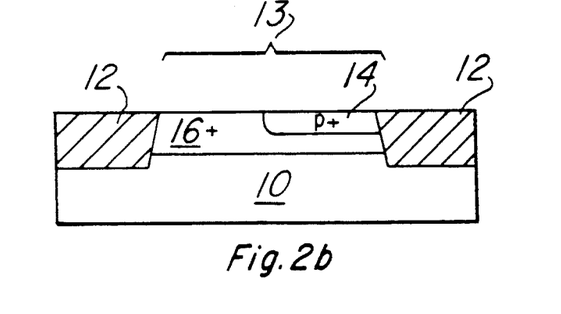
Figure 2C:
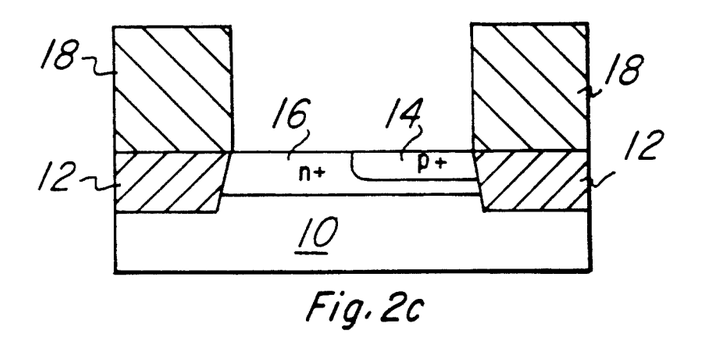
Figure 2D:
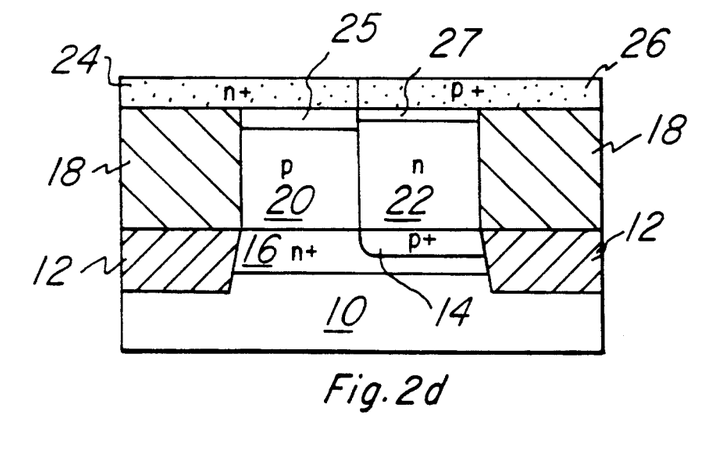
Figure 2E:
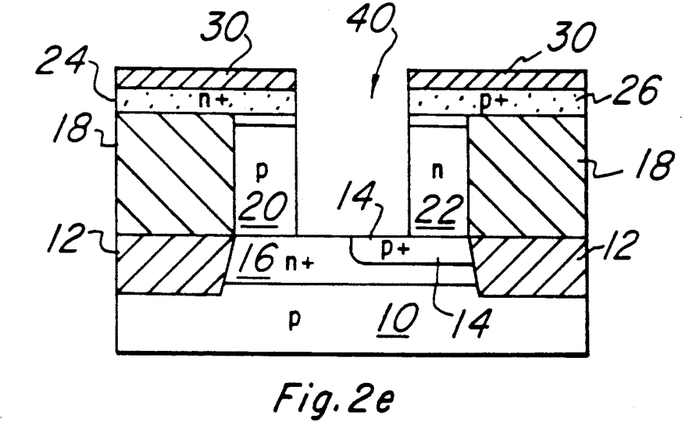
Figure 2F:
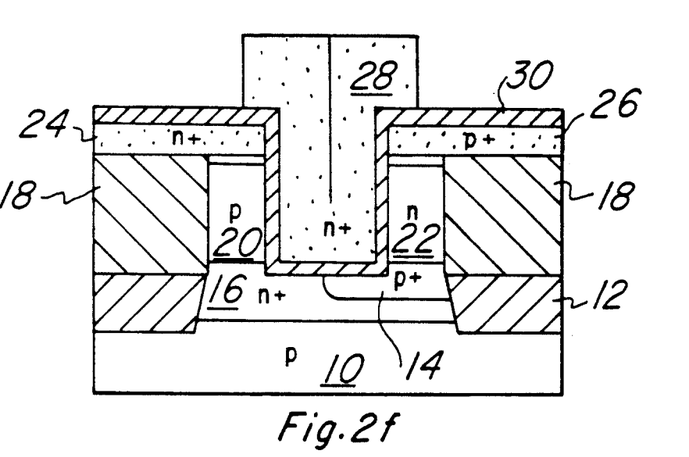

Thus, as shown in FIG. 2D, epitaxial regions 20 and 22 are formed in the recesses previously patterned in the thick oxide 18. FIG. 2D shows the lateral boundary between regions 20 and 22 as being approximately coincident with the lateral boundary between regions 14 and 16, but this is not necessarily true. In fact this coincidence or lack thereof is unimportant, since the portions of regions 20 and 22 directly over this boundary will be removed by a subsequent etch. A patterned implant (either using two masks or one) is then used to define the channel doping for regions 20 and 22 within the epitaxial material. After regions 20 and 22 have been formed (regions 20 and 22 are preferably but not necessarily coplanar with the top of thick oxide 18 as shown), an additional polysilicon layer is deposited over the surface of thick oxide 18 and the epitaxial material 20, 22. A patterned implant (using either one mask or two) is then used to define oppositely doped regions 24 and 26. Note that, during subsequent processing, n-type dopants will outdiffuse from layer 24 to form a shallow n+ diffusion 25 near the surface of a p-type epitaxial material 20, and similarly outdiffusion of dopants from p+ polysilicon layer 26 will form a shallow p+ diffusion 27 where the polysilicon 26 is in contact with epitaxial material 22.

A trench etch is next performed, to cut a trench 40 (in desired active device locations) through polysilicon layers 24 and 26, through epitaxial material 20, 22, 25, and 27, and down to (or slightly into) substrate regions 14 and 16. Next, oxide 30 is grown to line the trench 40. Depending on the growth conditions, oxide 30 will normally be thicker adjacent the polysilicon areas, and may also be somewhat thicker adjacent the heavily doped areas. However, this oxide will be at its thinnest near the lightly doped epitaxial material regions 20 and 22, and it is at these locations that the oxide 30 will serve as a gate oxide. Alternatively, a deposited dielectric could be used to provide all or part of the dielectric 30, and of course dielectrics other than silicon dioxide could be used. A second polysilicon layer 28 is then conformally deposited and etched, to provide the gate electrode 28. This second polysilicon layer is preferably heavily doped of one conductivity type, preferably n+ (which is conveniently achieved using POCl$_3$ doping). This provides the structure shown in FIG. 2F.

Figure 2G:
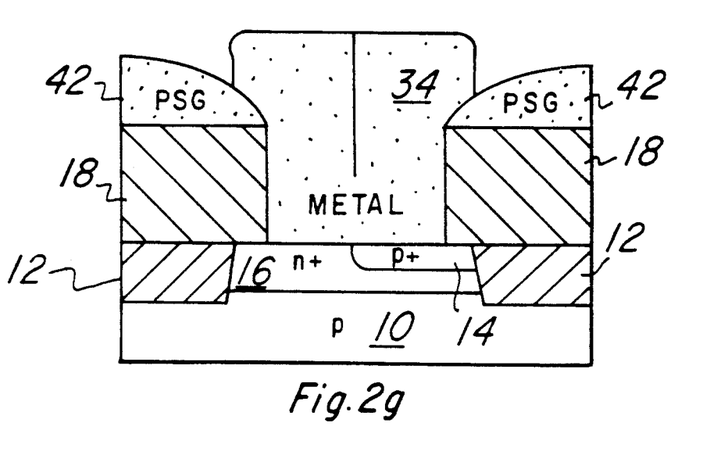

An interlevel dielectric 42 is then deposited, contacts are patterned and etched (using profile modification techniques if necessary, such as cantilever etching or BPSG reflow of layer 42). FIG. 2G shows a different location in the device, where the metal layer 34 makes contact to the buried diffusions 14 and 16. The recess in thick oxide 18 through which this contact is made is preferably etched out at the time of contact etch (rather than at the time when the earlier recesses are etched), so that epitaxy will not occur in the locations of the recesses for metal contact.

Figure 3:
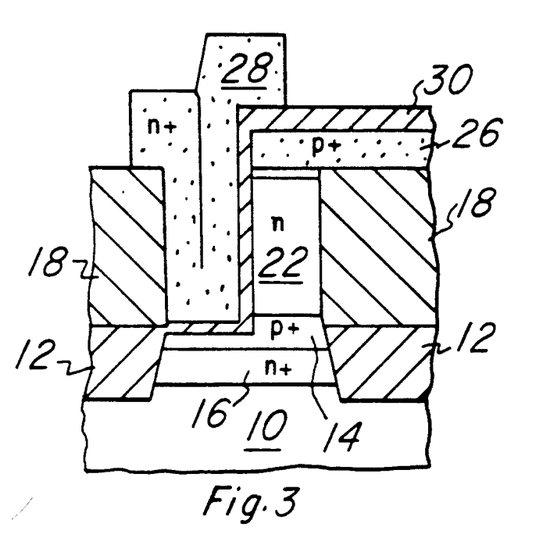
Figure 4:
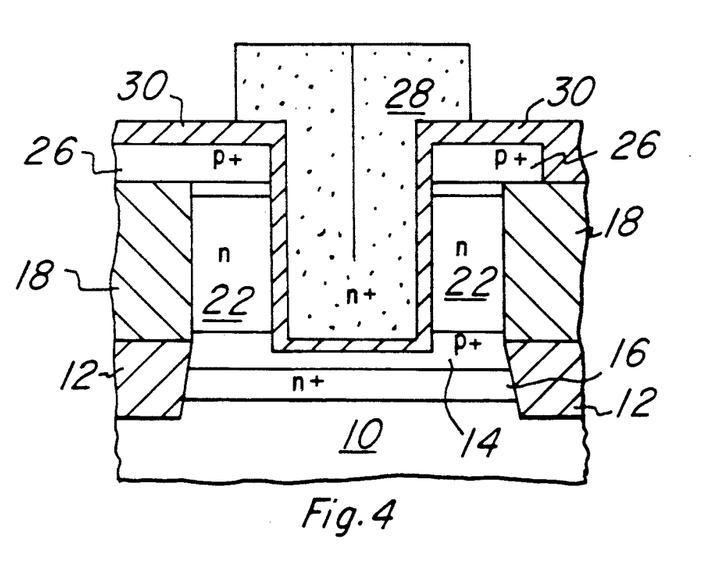

This example has shown fabrication of an inverter, where both a vertical PMOS device and a vertical NMOS device were included in a single recess. However, since the relevant dopings are generally defined by pattern implantations, this is not necessary. FIG. 3 shows a sample of another location, wherein a gate 28 addresses only a single PMOS device (with a channel in n-type epitaxial material 22), and FIG. 4 shows another example, where the gate 28 addresses two PMOS devices (which have their bottom source/drain terminals connected), one on each side of the trench. Thus, the present invention can be applied to provide integrated circuits which contain some recesses in which a PMOS device and an NMOS device share a common control gate, and other recesses which include two NMOS devices in series. The present invention can also be applied (by modifying the masked implantation step which differentiates channel region 20 from channel region 22) to provide devices of at least one conductivity type which have diverse thresholds; for example, by using two masked high-energy implants and in-situ doping, the present invention can provide four types of devices (e.g. high-threshold-voltage NMOS devices, normal NMOS devices, "natural" (i.e. low-threshold-voltage) NMOS devices, and PMOS devices).

Figure 5A:
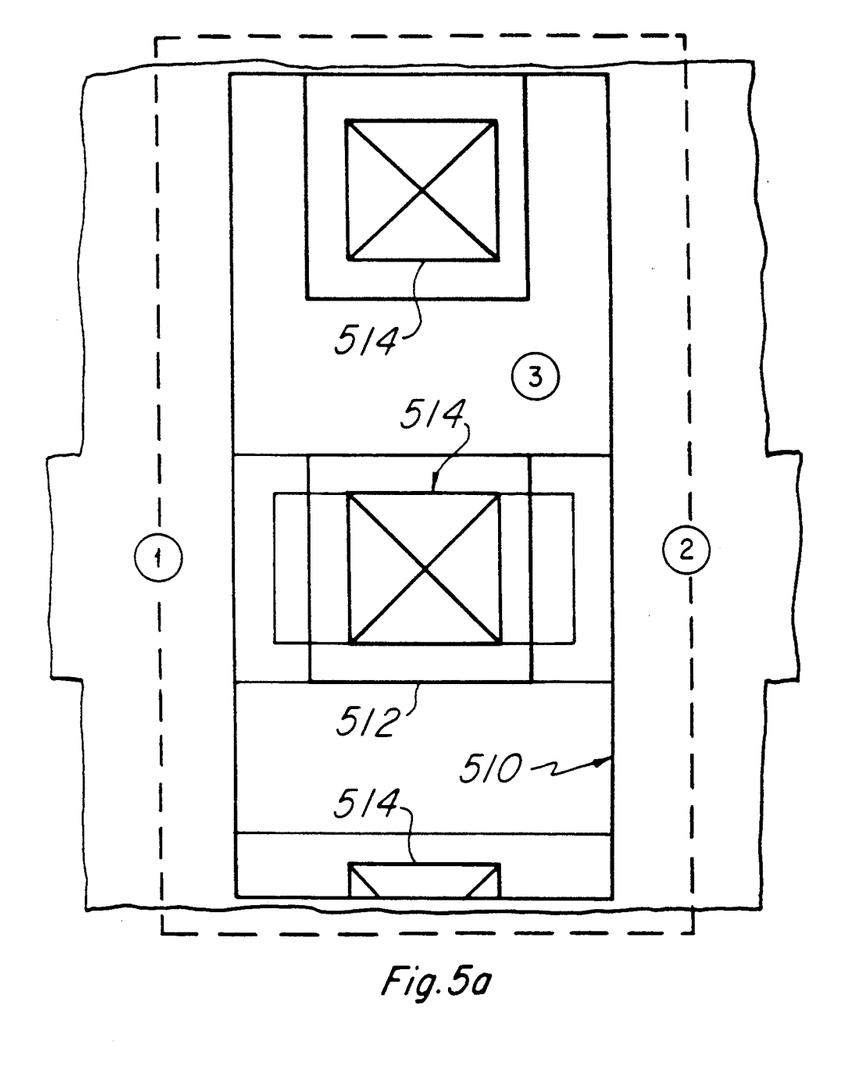
FIGS. 5A through 5C are overlaid views showing a sample mask layout for a single inverter cell such as that shown in FIG. 1.
Figure 5B:
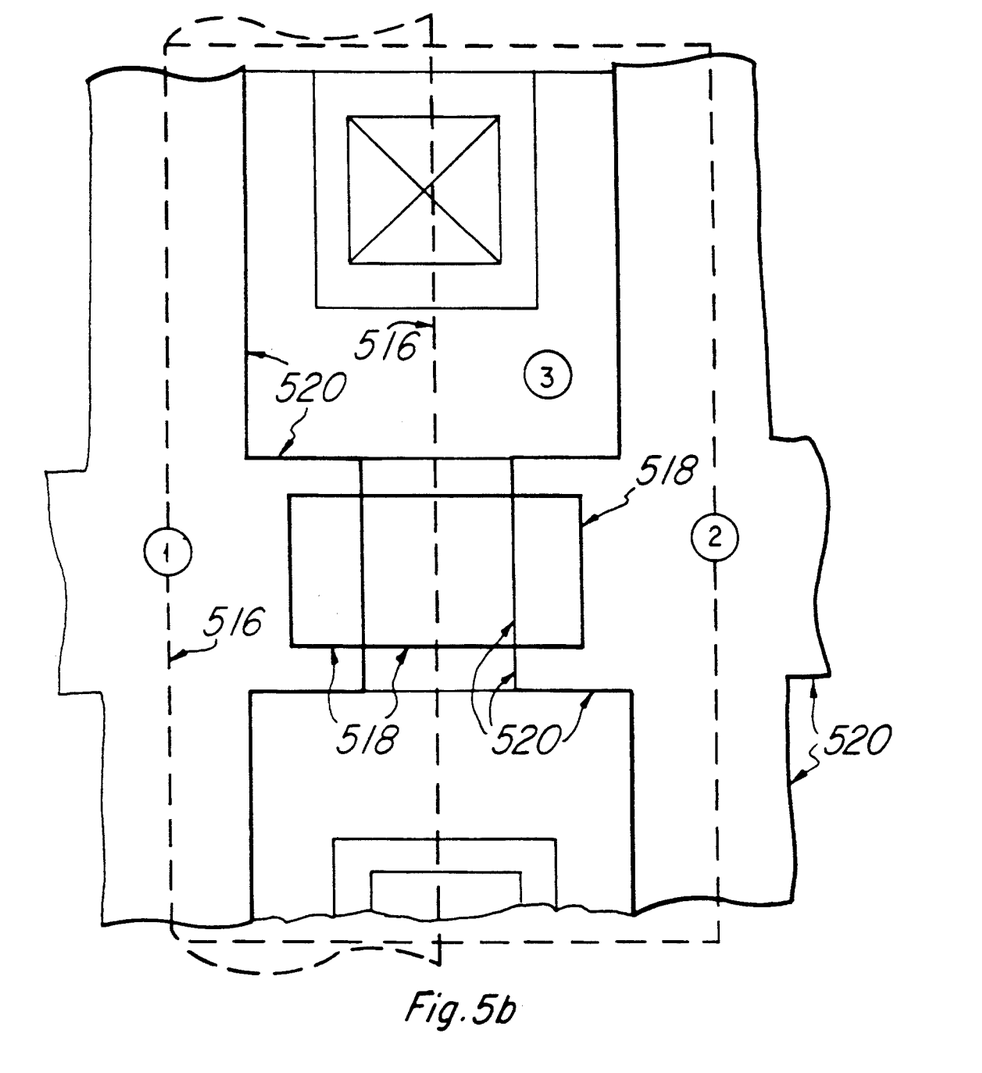
Figure 5C:
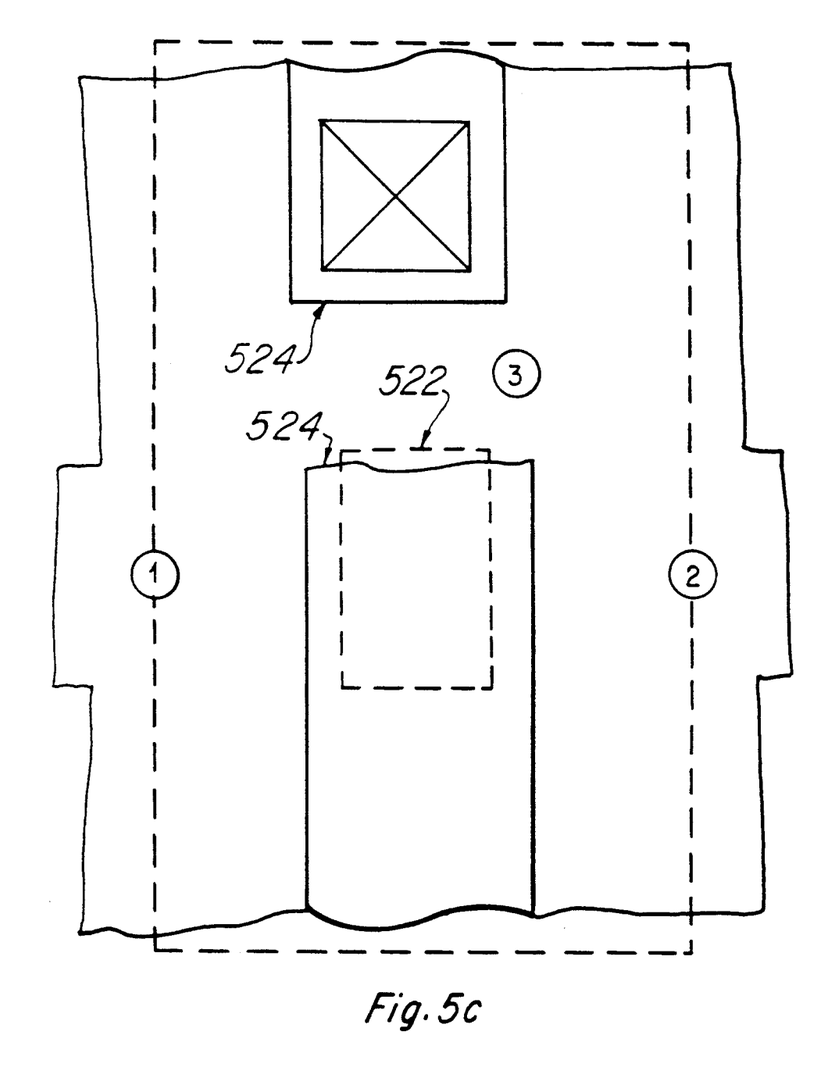

FIGS. 5A through 5C are coincident overlaid views showing a sample mask layout for a single inverter cell according to some embodiments of the present invention. Alignment points 1, 2, and 3 are shown on all three drawings, to indicate the overlay.

FIG. 5A shows moat mask 510 which defines the limits of the moat region 13 seen in FIGS. 2A and 2B, i.e. the limits of the oxide 12.

The implantation of the moat regions 13 to produce diffusions 14 and 16 is defined by mask 516, seen in FIG. 5B (or by its complement, depending on which of the dopant species is being masked).

The recesses in the dielectric 18 are defined by field mask 518, seen in FIG. 5B.

The implantation of the selective epitaxial material to produce channel regions 20 and 22 is defined by mask 516, seen in FIG. 5B (or by its complement, depending on which of the dopant species is being masked).

The implantation of the first polysilicon layer to produce n+ source/drain contact layers 24 and p+ source/drain contact layers 26 is defined by mask 516, seen in FIG. 5B (or by its complement, depending on which of the dopant species is being masked). The boundaries of the first polysilicon layer (poly 1 layer) are defined by mask 520, seen in FIG. 5B (or by its complement, depending on which of the dopant species is being masked), and also by the trench etch (defined by mask 522). In this embodiment, the n+ portion of the poly 1 layer is used as the ground bus, and the p+ portion 26 of the poly 1 layer is used as the $V_{DD}$ bus.

The locations of the trenches 40 are defined by mask 522, seen in FIG. 5C.

The boundaries of the second polysilicon layer, including the location of control gates 28, are defined by mask 512, shown in FIG. 5A.

The locations of the contacts are defined by mask 514, seen in FIG. 5A. The contact hole locations are further marked by being filled in with a large X.

The boundaries of the metal layer 34, are defined by mask 524, shown in FIG. 5C.

Figure 6:
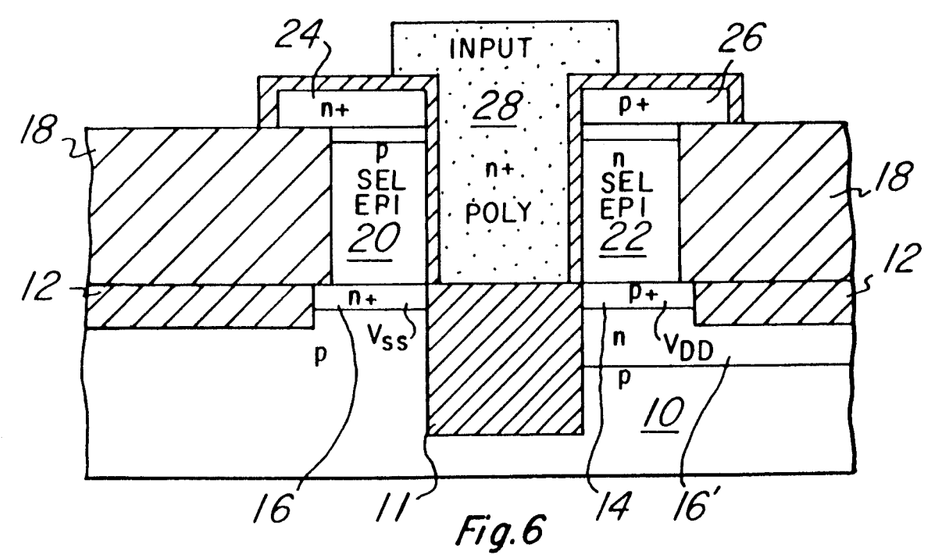
FIG. 6 shows an example of another class of embodiments of the present invention, where buried diffusions are used for power and ground bussing, and a trench in the substrate is used to provide separation between them.

FIG. 6 shows an alternative embodiment of the present invention. In this case, the buried diffusions are used for power and ground bussing, and a trench in the substrate is used to provide separation between them. In this embodiment, a p-type substrate 10 has a field oxide 12 defining moat regions, and has p+ diffusions 14 and n+ diffusions 16 in the moat regions. In this case, the p+ diffusions 14 are junction isolated by an n-type layer 16'. An oxide filled trench 11 laterally separates the p+ diffusions from the n+ diffusions 16, so that the diffusions 14 and 16 can be used for power and ground bussing with minimum risk of latchup. An epitaxial layer containing p-type regions 20 and n-type regions 22 provides channel regions for vertical active devices, and a polysilicon layer including n+ regions 24 and p+ regions 26 provides contacts to the top source/drains of the vertical active devices. The separation of the buried diffusions from each other requires extra processing to provide the oxide filled trench 11, but provides the major advantage that now all of the single inputs and outputs are directly accessible at topside contacts. That is, FIG. 6 shows a vertical NMOS transistor and a vertical PMOS transistor, both addressed by the gate 28 in the poly 2 layer, with the NMOS transistor having an output node on poly 1 region 24 and the PMOS transistor having an output node on poly 1 region 26. These output nodes can be strapped together to provide a simple inverter, but it is also optionally possible to use them separately. This is quite advantageous in configuring random logic.

In many embodiments of the present invention, it will be useful to perform a self-aligned direct react silicidation step to form titanium nitride local interconnects. The titanium nitride local interconnects are advantageous in connecting the p+ portions 26 of the poly 1 layer to either the n+ portions 24 of poly 1 or to n+ gate 28 in the poly 2 layer, since titanium nitride is such a good diffusion barrier.

Figure 8:
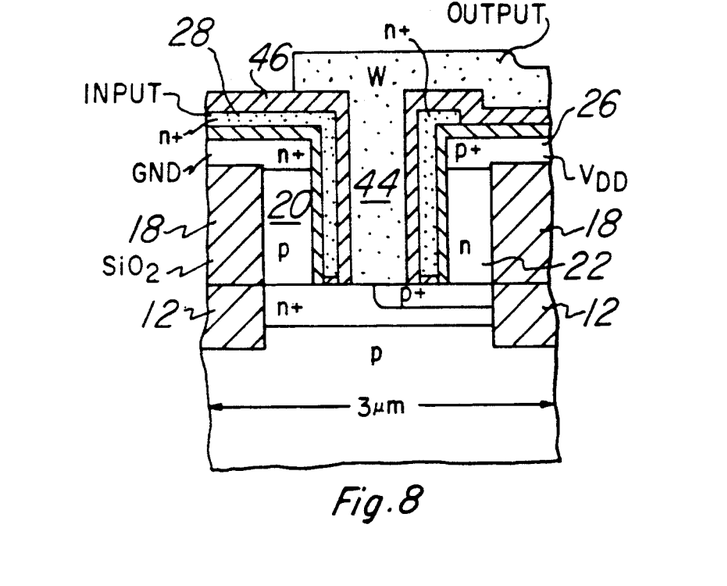
FIG. 8 shows another class of alternative embodiments. where the logic gate's output is provided by a stud contact which reaches through the input gate.

In another class of alternative embodiments, as shown in FIG. 8, the logic gate is configured so that the output is provided by diffusions 14 and 16, which are accessed by a stud contact 44 as shown in FIG. 8. A sample process modification to achieve this is to deposit the polysilicon 28 sufficiently thin that it does not fill the trench, but merely covers the trench sidewalls and leaves a void in the middle. (In implementing this embodiment, a planarized nitride plug is preferably used to temporarily fill this void and permit increasing the thickness of the top oxide 46, so that metal stud 44 can contact the diffusions 14, 16 at the bottom of the hole without shorting to the polysilicon line 28.) Next, insulating oxide 46 is grown or deposited on the sidewalls of this hole to insulate the input gate 28 in the poly 2 layer from the output line 44, and a conformal metal deposition (e.g. CVD tungsten) is then performed to form the output line 44. This embodiment has the disadvantage of very large coupling capacitance from the input line 28 to the output line 44, but has the advantage of increased compactness and horizontal dimension.

Figure 7A:
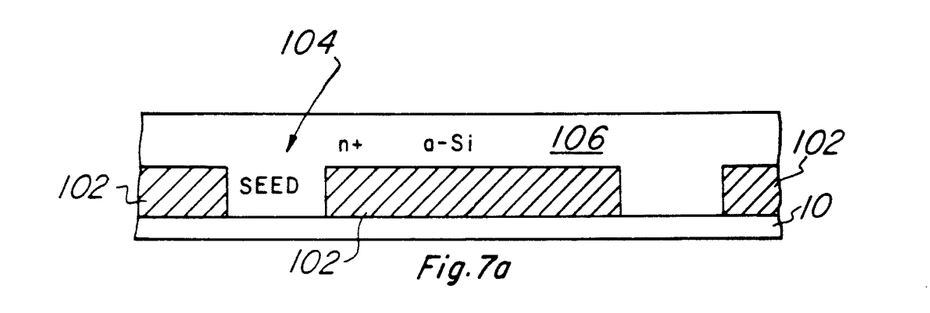
FIGS. 7A, 7B, and 7C show key steps in a process sequence for achieving this structure.
Figure 7B:
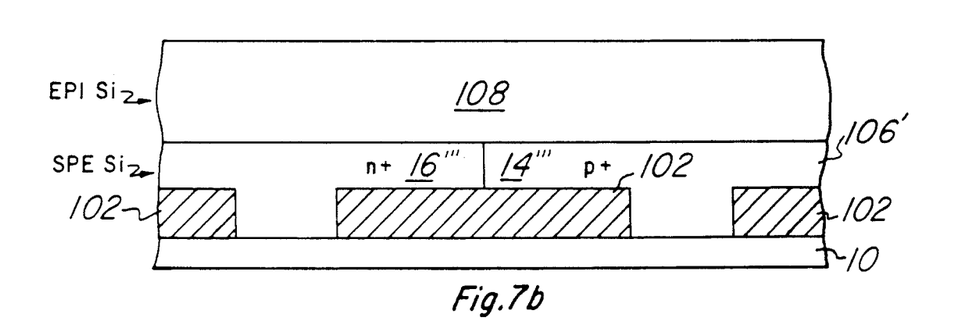
Figure 7C:
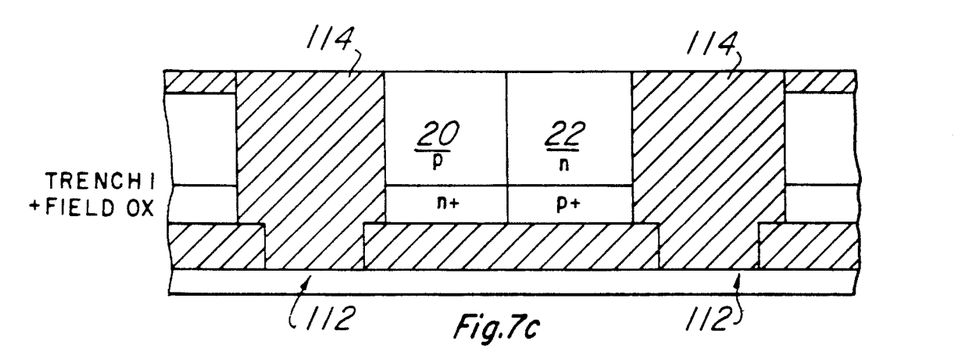
Figure 9:
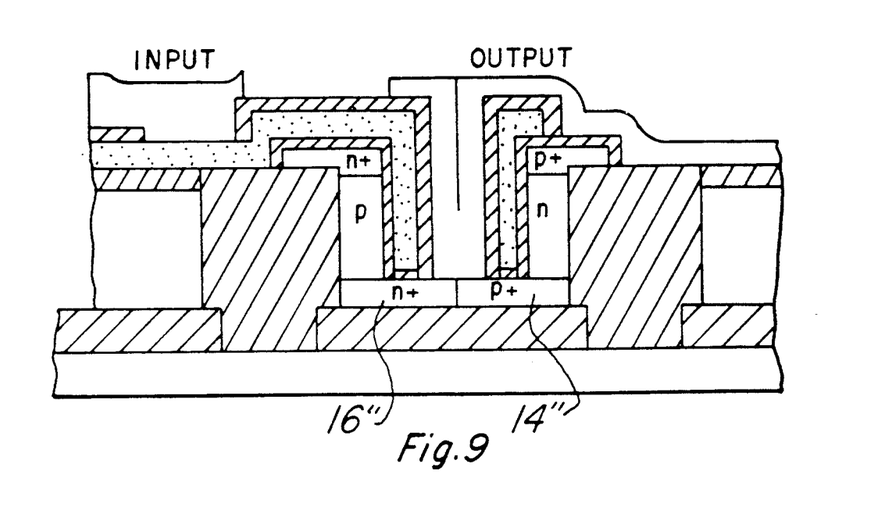
FIG. 9 shows another class of embodiments of the present invention, wherein the bottom n+ and p+ source/drain diffusions 14" and 16" are fully oxide isolated.

FIG. 9 shows another class of embodiments of the present invention, wherein the bottom n+ and p+ source/drain diffusions 14" and 16" are fully oxide isolated. This can be achieved, for example, by solid phase epitaxy as shown in FIGS. 7A, 7B, and 7C. As shown in FIG. 7A, a monocrystalline silicon substrate 10 has a masking layer 102 formed on it and patterned to have openings 104 close to desired locations of active device area. An amorphous silicon layer 106 is then deposited, e.g. by plasma enhanced deposition at 200 degrees C. As is well known in the art, heating the substrate 10 and amorphous silicon layer 106 will then produce recrystallization of layer 106 in alignment with the crystal lattice pattern of substrate 10. This recrystallized layer will be of reasonably good quality as long as the crystallization does not have to propagate for very long distances, e.g. not more than a few microns. The recrystallized layer 106' is then doped by implantation to form regions 16'" and 14'". An epitaxial silicon layer 108 is then grown over the recrystallized layer 106', to form the structure of FIG. 7B. Isolation trenches 112 are then etched and then refilled with an isolation dielectric 114, to remove the connection from the n+ layer 16'" and p+ layers 14'" to the original substrate 10. That is, the isolation locations 112 will generally cover the seed hole locations 104. Patterned implantation of the epitaxial layer 108 then provides p-type channel regions 20 and n-type channel regions 22, and processing can continue according to one of the options outlined above. Alternatively, a very similar structure could be achieved merely by stargin out with a silicon-on-insulator wafer, e.g. one in which $10^{18}$ cm$^{-2}$ or more of oxygen (or nitrogen) ions had been implanted into silicon and annealed at very high temperature to form a buried oxide (or nitride) layer under a crystalline silicon layer.

Another sample specific process flow for manufacturing the present invention is as follows. (The details of cleanups, ashing steps, deglazes, and similar obvious minor steps is omitted, since such implementation steps are obvious to those skilled in the art.)

The starting wafers are <100> silicon, doped p-type to a resistivity of 10–15 Ω-cm.

First, an MF$^3$R (SWAMI) process is used to define the moats 13, surrounded by oxide 12, as seen in FIG. 2A. For example, 350 Å of oxide are grown and 1400 Å of nitride deposited by LPCVD, a masked etch removes the protective oxide/nitride cap except over moat areas 13, and then a silicon etch is used to recess the silicon where oxide 12 will be located to 1000 Å depth. A channel stop implant (e.g. 3E12 cm$^{-2}$ of boron at 100 keV) is then applied. Oxide 12 is then grown (e.g. to 7500 Å) and planarized.

Buried diffusions 16 are formed by a blanket implant, e.g. 2E15 cm$^{-2}$ of phosphorus at 310 keV. Resist is then patterned to expose the desired locations of p+ source/drains 14 to a boron implant, e.g. 2E15 of boron at 45 keV. This provides the structure of FIG. 2B.

Dielectric 18 is then formed, e.g. as 14000 Å of densified LPCVD oxide over 250 Å of grown oxide. A patterned etch then etches a recess 17 into the dielectric 18, as seen in FIG. 2C.

A selective epitaxial growth step is then performed (e.g. SiH$_2$Cl$_2$ at 1000 C. at atmospheric pressure. This will grow epitaxial material on the exposed silicon regions 14, 16, but will not deposit any material on the dielectric 18. Preferably the epitaxial material is grown to a thickness to be approximately coplanar with dielectric 18; optionally, it can be planarize it with the surface of dielectric 18 by resist etchback techniques.

The channel regions 20 and 22 are then doped, e.g., by a blanket triple phosphorus implant (e.g. 8E11 cm$^{-2}$ at 360 keV + 5E11 cm$^{-2}$ at 170 + 1E11 cm$^{-2}$ at 50 keV) followed by a masked five-way boron implant (e.g. 3E12 cm$^{-2}$ at 320 keV + 2E12 cm$^{-2}$ at 150 keV + 1E12 cm$^{-2}$ at 70 keV + 8E11 cm$^{-2}$ at 35 keV + 7E11 cm$^{-2}$ at 10 keV).

The first thin film polysilicon layer (which forms the regions shown as 24 and 26 in FIG. 2D) is then formed, e.g. by depositing 5000 Å of polysilicon, blanket implanting e.g. 1E15 cm$^{-2}$ of phosphorus at 240 keV to form regions 24, and performing a masked implant (e.g. 1E15 cm$^{-2}$ of boron at 100 keV) to dope the regions 26. This polysilicon layer is relatively thick to provide more processing margin during the deep contact etch which forms the contact structures such as shown in FIG. 2G. The n+ implant could be performed at a lower energy, by placing more reliance on the relatively high diffusivity of polysilicon to distribute the dopant vertically. This produces the structure of FIG. 2D. (The shallow n+ diffusion 25 between polysilicon layer 24, and the shallow p+ diffusion 27 below the p+ polysilicon layer 26, will be formed by outdiffusion of dopant species from the polysilicon layers into the crystalline layers 20 and 22, including some outdiffusion which occurs during subsequent processing steps.)

An oxide hardmask 30 is now deposited, e.g. to 3500 Å, and etched to expose desired trench locations 40. A timed trench etch (using, e.g., a chlorine-base chemistry in RIE mode, i.e. at low total pressure) is performed to etch (where exposed by hardmask 30) through layers 24, 26, 20, and 22, and into but not through layers 14 and 16. This provides the structure shown in FIG. 2E.

A dummy oxide is now grown and stripped, and gate oxide 31 is grown. (Of course, the thickness of oxide 30 will normally be slightly decreased during the preceding oxide strip, and slightly increased during this growth step.) Polysilicon is now deposited, e.g. to 4500 Å, and doped, e.g. by using POCl$_3$ at 900 C. An optional oxide deposit and etchback step is now preferably used, to fill voids in this polysilicon layer. That is, this polysilicon layer is preferably deposited a thickness close to half the width of the trench 40, but the deposition thickness alone will not always ensure that no voids occur; deposition and 100%–120% etchback of an LPCVD oxide prevents any voids from causing problems. This polysilicon layer is now patterned and etched, to define interconnects and a plurality of control gates 28. This produces the structure shown in FIG. 2F.

Another optional but advantageous process modification is preferably now inserted: in view of the rather steep topographies introduced by some of the foregoing and following steps, a general planarization step is now inserted. In this example, 10000 Å of LPCVD oxide is deposited, and a resist coat is spun on and hardbaked, and an etch which has approximately 1:1 etch rate ratios between oxide and hard resist is applied until the polysilicon structures 28 are generally exposed. This step will provide oxide filaments, underlying the interlevel dielectric 42, in locations where the topography had been severe. The interlevel dielectric 42 is now formed, e.g. by depositing 1000 Å followed by 4000 Å of phosphosilicate glass, followed by a short reflow for smoothing.

Contacts are now formed, e.g. by patterning a resist mask and using an oxide etch to etch through layers 42 and 18 to reach (where not protected by the resist mask or by an overlying polysilicon layer) diffusions 14 and 16, first polysilicon layer 24 and 26, and second polysilicon layer 28. Since the polysilicon 28 will be exposed to the etch for a long time while the etch is chewing down through dielectric 18, this etch is preferably done using chemistry which is very selective to polysilicon (such as a chemistry which includes a bromine-based sidewall passivant, e.g. HCl/HBr). Alternatively, of course, an extra mask can be used at this stage, to form the contacts to substrate separately from the contacts to polysilicon.

The process continues with more conventional steps. In the presently preferred embodiment, metal is now deposited (e.g. 600 Å of TiW followed by 3000 Å of CVD tungsten, followed by 5000 Å of Al-1% Si), patterned with dyed resist, etched, and sintered. Finally, a protective overcoat of silicon nitride is plasma deposited and etched to expose bond pad locations.

The tremendous compaction of the present invention is particularly advantageous for discretionary wiring configurations. For example, one application of the present invention is to integrated circuits having blocks of three trenches laid out so that each block can be wired (by very slightly changing the metal pattern) to configure a NAND gate, a NOR gate, or a buffer. In one sample embodiment, where each of the trenches includes both a PMOS device and an NMOS device, this is achieved by: in the first recess, connecting the high supply line (e.g. +5 V) to the source of the PMOS device, while leaving the NMOS device with a floating source; in the second recess, connecting the low supply line (e.g. ground, 0 V) to the source of the NMOS device, while leaving the PMOS device with a floating source. This basic cell can be configured to achieve various gates as follows:

To achieve a NOR gate.
the first input is applied to the control gate of the first and second recesses,
the second input is applied to the control gate of the third recess,
the output of the first recess is connected to the PMOS source (the top p+) of the third recess.
the output of the second recess is wired in parallel with the output of the third recess to provide the gate's output, and
the NMOS source (top n+) of the third trench is connected to the low supply rail (e.g. ground).

To achieve a NAND gate,
the first input is applied to the control gate of the first and second recesses,
the second input is applied to the control gate of the third recess,
the output of the second recess is connected to the NMOS source (the top n+) of the third recess,
the output of the first recess is wired in parallel with the output of the third recess to provide the gate's output, and
the PMOS source (top p+) of the third recess is connected to the high supply rail (e.g. +5 V).

To implement a buffer,
the input is applied to the control gates of the first and second recesses,
the outputs of the first and second recesses are both connected in parallel to the control gate of the third recess.
the PMOS source (top p+) of the first recess and the the PMOS source (top p+) of the third recess are both connected to the high supply rail.
the NMOS source (top n+) of the second recess and the NMOS source (top n+) of the third recess are both connected to the low supply rail, and
the output of the third recess provides the output of the gate.

The present invention provides innovative concepts with widely applicable novelty, and an immense variety of modifications and variations of the basic innovative concepts taught can be recognized by those skilled in the art, at present and in the future. In addition to the various modifications and variations described above, several others will now be discussed. It should be recognized that the various modifications, variations, and alternative embodiments discussed do not delimit the scope of the invention, which is defined only by the claims; the following examples are included for illustration, but they are most certainly not exhaustive.

For example, the control gate is preferably n+ polysilicon, but instead it could be a polysilicon/silicide sandwich structure, or a silicide, or a metal, as long as stable and acceptable interface characteristics can be obtained (e.g. low trap density and low mobile ion density).

The gate dielectric is preferably a grown layer of silicon dioxide, but of course other materials can be used, such as silicon oxynitrides or (if the channel is a III-V semiconductor) a wide-bandgap semiconductor material such as $Al_{0.5}Ga_{0.5}As$.

The channel region must be a semiconductor, and it is greatly preferable that this region be substantially monocrystalline, but other semiconductors besides silicon can be used. $Si_xGe$ could be used, or III-V compounds such as GaAs or others. The thickness of the channel region (i.e. the lateral distance through the channel from the gate dielectric to the backside interface with the thick dielectric) is primarily defined by alignment tolerances; about 0.5 micron is presently preferred, but any thickness which (in combination with the fixed charge characteristics of the backside interface) will permit acceptable MOS transistor operation at acceptable gate voltages (as may be readily calculated by those skilled in the art) may be used instead. The width of the channel region is merely adjusted (subject to a minimum defined by lithographic requirements) to achieve the drive current desired for this particular device, as will be well understood by those skilled in the art of integrated circuit design. The device layouts shown are examples where the p-channel and n-channel devices have equal channel widths. but of course this can be varied as desired simply by changing the mask patterns used. In particular, it may in some applications be preferable to form the control gate in a recess which is L-shaped (rather than running straight across the middle of the recess), so that the p-channel device has a wider channel than the n-channel device in the same recess. Similarly, by varying this pattern, it is also possible to place three or more active devices in one recess, although this is not particularly preferable (since all those devices will tend to have a gate terminal and one of their source/drain terminals in common, unless additional processing steps are introduced to avoid this). For example, in embodiments where depletion devices are used, several depletion loads could be located in a single trench. In general, while the present invention is most preferable and advantageous in CMOS, it can also be applied to NMOS or other circuit technologies, particularly where the channel implants are partially masked to provide more than one threshold voltage. Further alternative embodiments of the invention vary these implants to provide more than one threshold voltage and also provide more than one conductivity type.

The examples shown emphasize embodiments where a single recess contains a PMOS and an NMOS device, but this too can be varied. For example, a single integrated circuit may contain both such PN recesses and also NN recesses (two NMOS devices in a single recess) and/or PP recesses (two PMOS devices in a single recess) and/or other recesses with one NMOS device and/or other recesses with three devices in them.

In the presently preferred embodiment, contact to the top source/drains is made by a single polysilicon thin film layer, which is doped with opposite conductivity types in appropriate locations to provide ohmic contact (and also a dopant source for the top source/drain) for both NMOS and PMOS devices. However, while this is preferable, it is not strictly necessary to the invention. For example, this top layer too could be annealed to improve its crystallinity, or even totally recrystallized. Other conductive materials could be used; for example, TiN or a metal could be used for this layer, and a patterned implantation used to define the n+ and p+ source/drains directly.

Similarly, the bottom source/drains can be junction-isolated buried diffusions in the substrate, or can be oxide-isolated recrystallized material, or can be formed in various other ways. Contact to the bottom source/drains can be made very close to the end of the channel (within the same recess as the channel), or can be made in a separate contact recess which is separate from but close to the channel recess, or these source/drains can be extended to provide a buried interconnect layer.

Similarly, the various innovative methods described can also be widely modified and varied.

For example, it is preferred that the control gate be formed by deposition of a thin film layer which has a minimum thickness sufficient to fill a trench between two insulated channel regions reasonably well—e.g. a minimum thickness between 40% and 60% of the minimum width of the trench—but, as will be recognized by those skilled in the art of processing integrated circuits, this too can be widely varied.

Thus, as will be appreciated by those skilled in the art, the present invention can be widely modified and varied, and its scope is not limited except as specified in the allowed claims.

What is claimed is:

1. An integrated circuit device comprising:
   a dielectric layer having a recess therein;
   an n-type insulated gate vertical-channel field effect transistor having its vertical-channel within, and on one side of said recess;
   a p-type insulated gate vertical-channel field effect transistor having its vertical-channel within, and on another side of said recess opposite from the vertical-channel of said n-type insulated gate vertical-channel field effect transistor; and
   a control gate disposed in said recess between said n-type and p-type insulated gate vertical-channel field effect transistors connected to control current flow in said vertical-channel of both said n-type and said p-type insulated gate vertical-channel field effect transistors.

2. The device of claim 1, wherein said recess has substantially vertical sidewalls.

3. The device of claim 1 wherein said dielectric comprises an oxide of silicon.

4. The device of claim 1, wherein said control gate is part of a thin film layer which has a constant thickness which is at least 20% to 50% of the minimum width of said recess.

5. The device of claim 1, wherein said control gate is separated from said respective vertical-channel regions of said n-type and p-type insulated gate vertical-channel field effect transistors by a gate dielectric having a dielectric thickness less than, 500 A of silicon dioxide.

6. The device of claim 1 further comprising a plurality of other recesses in said dielectric layer containing respective n-channel transistors, wherein some of said respective a n-channel transistors have width-to-length ratios (W/L) significantly different from the width-to-length ratios of others of said respective n-channel transistors.

7. An integrated circuit device comprising:
   a dielectric layer including therein a recess with substantially vertical sidewalls;
   a first insulated gate field effect transistor disposed within and adjacent to a first sidewall of said recess, said first insulated gate field effect transistor having a first source/drain and a second source/drain separated from one another vertically along said first sidewall of said recess by a channel region and a second insulated gate field effect transistor disposed within and adjacent to a second sidewall of said recess, said second insulated gate field effect transistor having a first source/drain and a second source/drain separated from one another vertically along said second sidewall of said recess by a channel region, wherein said first and second insulated gate field effect transistors are of complementary conductivity types; and
   a control gate disposed within said recess between the channel regions of said first and second insulated gate field effect transistors to control current flow in both said first and second transistors.

8. The device of claim 7, wherein said control gate is part of a thin film layer which has a constant thickness which is at least 20% to 50% of the minimum width of said recess.

9. The device of claim 7, wherein said channel region of each of said first and second insulated gate field effect transistors is essentially monocrystalline.

10. The device of claim 7, wherein said control gate is capacitively coupled to said channel regions through gate dielectrics each having a dielectric thickness less than 500 A of silicon dioxide.

11. The device of claim 10, wherein each of said gate dielectrics is less than 300 Angstroms thick and consists essentially of silicon dioxide.

12. The device of claim 7, wherein said control gate contains more than 30% silicon by atomic weight and is not monocrystalline.

13. The device of claim 7, wherein said dielectric layer has a thickness in the ranger of 6000 A–15000 A inclusive.

14. The device of claim 7, wherein said first and second insulated gate field effect transistors each have a minimum thickness, between said control gate and one of said first and second sidewall of said dielectric layer, in the range of 1000 A–8000 A inclusive.

15. The device of claim 7, further comprising a plurality of other recesses in said dielectric layer , at least one of which contains only a single transistor.

16. The device of claim 7, wherein said second source/drains of both said first and second insulated gate field effect transistors are ohmically contacted at a contact hole within said recess.

* * * * *